(12) United States Patent
Sute

(10) Patent No.: US 11,146,257 B2
(45) Date of Patent: Oct. 12, 2021

(54) LATCHING DC SWITCH CIRCUIT WITH OVERCURRENT PROTECTION USING FIELD EFFECT TRANSISTORS

(71) Applicant: DENSO International America, Inc., Southfield, MI (US)

(72) Inventor: Steven Sute, Dearborn, MI (US)

(73) Assignee: DENSO International America, Inc., Southfield, MI (US)

( * ) Notice: Subject to any disclaimer, the term of this patent is extended or adjusted under 35 U.S.C. 154(b) by 132 days.

(21) Appl. No.: 16/703,446

(22) Filed: Dec. 4, 2019

(65) Prior Publication Data

US 2021/0175881 A1 Jun. 10, 2021

(51) Int. Cl.
| | | |
|---|---|---|
| H03K 17/00 | (2006.01) | |
| H03K 17/082 | (2006.01) | |
| H03K 17/687 | (2006.01) | |
| H03K 17/081 | (2006.01) | |

(52) U.S. Cl.
CPC ... *H03K 17/0822* (2013.01); *H03K 17/08116* (2013.01); *H03K 17/6874* (2013.01)

(58) Field of Classification Search
None
See application file for complete search history.

(56) References Cited

U.S. PATENT DOCUMENTS

| | | | | |
|---|---|---|---|---|
| 3,916,220 A | * | 10/1975 | Roveti | H03K 17/6874 361/98 |
| 4,485,342 A | | 11/1984 | Hill et al. | |
| 4,555,742 A | * | 11/1985 | Gray | H03K 17/615 330/207 P |
| 4,653,084 A | | 3/1987 | Ahuja | |
| 4,709,160 A | | 11/1987 | Kinoshita | |
| 4,924,344 A | * | 5/1990 | Guajardo | H02H 9/04 361/101 |
| 5,388,022 A | | 2/1995 | Ahuja | |
| 5,424,892 A | * | 6/1995 | Topp | H03K 17/04123 361/18 |
| 5,581,433 A | | 12/1996 | Jordan | |
| 5,920,452 A | * | 7/1999 | Sullivan | H03K 17/0822 361/101 |
| 6,031,705 A | | 2/2000 | Gscheidle | |
| 6,130,813 A | | 10/2000 | Kates et al. | |

(Continued)

*Primary Examiner* — Tuan T Lam
(74) *Attorney, Agent, or Firm* — Harness, Dickey & Pierce, P.L.C.

(57) ABSTRACT

An overcurrent protection circuit includes switches, resistors, and a voltage divider. A first switch includes a first control terminal and switches current to a load. The first resistor is connected in series with the first switch. The second resistor is connected in series with a second control terminal of the second switch and an output terminal of the overcurrent protection circuit. The voltage divider is connected in series with the second switch and has a center terminal connected to the first control terminal. A DC source voltage is across the second switch and the voltage divider. A latching circuit is provided by the switches, the voltage divider, the first resistor and the load. The second switch discharges the first switch to limit current to the output terminal in response to a voltage drop across the first resistor indicating current supplied to the output terminal has exceeded a threshold.

20 Claims, 9 Drawing Sheets

(56) References Cited

U.S. PATENT DOCUMENTS

| | | | | |
|---|---|---|---|---|
| 6,339,236 B1* | 1/2002 | Tomii | ............... | H03K 17/785 |
| | | | | 257/228 |
| 6,603,221 B1 | 8/2003 | Liu | | |
| 2009/0027818 A1* | 1/2009 | Adi | ............... | G06F 13/4081 |
| | | | | 361/75 |
| 2009/0273958 A1 | 11/2009 | Baby | | |
| 2010/0039163 A1* | 2/2010 | Nagasawa | ......... | H03K 17/0822 |
| | | | | 327/534 |
| 2014/0016381 A1 | 1/2014 | Sun | | |
| 2014/0291721 A1* | 10/2014 | Robbins | ............. | H01L 27/0266 |
| | | | | 257/134 |
| 2017/0214313 A1* | 7/2017 | Kikuchi | ................ | H02H 3/093 |

* cited by examiner

LATCHING DC SWITCH CIRCUIT WITH OVERCURRENT PROTECTION USING FIELD EFFECT TRANSISTORS

FIELD

The present disclosure relates to overcurrent protection circuits.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Vehicles include numerous electronic components, actuators, modules and/or other electronic devices. One or more control modules may be used to supply power to the electronic devices. Some of the electronic devices are supplied corresponding direct current (DC) voltages, which may be switched ON and OFF as needed. Switch circuits for switching the DC voltages ON and OFF can be complex and dissipate considerable power.

SUMMARY

An overcurrent protection circuit is provided and includes first and second switches, first and second resistors, and a voltage divider. The first switch includes a first control terminal and configured to switch current to a load ON and OFF. The first resistor is connected in series with the first switch. The second switch includes a second control terminal. The second resistor is connected in series with the second control terminal and an output terminal of the overcurrent protection circuit. The voltage divider is connected in series with the second switch and having a center terminal. The center terminal is connected to the first control terminal. The direct current source voltage is received across the second switch and the voltage divider. The latching circuit is provided by the second switch and the voltage divider being connected in parallel with the first switch, the first resistor and the load. The second switch discharges the first switch to limit current to the output terminal in response to a voltage drop across the first resistor indicating current supplied to the output terminal has exceeded a predetermined threshold.

In other features, the overcurrent protection circuit further includes a control module configured to generate a close control signal to close the first switch. The center terminal of the voltage divider and the first control terminal of the first switch are configured to receive the close control signal.

In other features, the overcurrent protection circuit further includes a control module configured to generate an open control signal to open the second switch. The second control terminal of the second switch is configured to receive the open control signal.

In other features, the first resistor and the load form a voltage divider with a center terminal being the output terminal.

In other features, the overcurrent protection circuit further includes a control module configured to: supply and pulse a close control signal to the first switch to activate the latching circuit; and supply and pulse an open control signal to the second switch to deactivate the latching circuit.

In other features, the first switch and the second switch are metal-oxide-semiconductor field effect transistors.

In other features, the first switch and the second switch, while operating as part of the latching circuit, are configured to maintain a previous state without receiving a signal from a circuit external to the overcurrent protection circuit.

In other features, the voltage drop across the first resistor triggers the second switch to discharge a gate of the first switch and open the first switch to prevent current from being supplied to the load.

In other features, an overcurrent protection system is provided and includes: the overcurrent protection circuit; and a diagnostic circuit connected to the output terminal. The diagnostic circuit is configured to generate a diagnostic circuit output indicative of a diagnostic state of the overcurrent protection circuit.

In other features, the overcurrent protection system further includes a processing module configured to generate a diagnostic control signal to power ON the diagnostic circuit. The diagnostic circuit is configured to generate the diagnostic circuit output based on a last state of the diagnostic control signal received from the processing module.

In other features, the diagnostic circuit is configured to generate the diagnostic circuit output by looking up the diagnostic state in a lookup table using the last state of the diagnostic control signal and the diagnostic circuit output.

In other features, the diagnostic circuit includes: a third switch receiving a diagnostic control signal; and a fourth switch and a fifth switch controlling generation of the diagnostic circuit output based on an output of the third switch and an output of the overcurrent protection circuit.

In other features, an overcurrent protection circuit system is provided and includes: a first metal-oxide-semiconductor field effect transistor (MOSFET) including a first gate and configured to switch current to a load ON and OFF; a first resistor connected in series with the first MOSFET; a second MOSFET including a second gate; a second resistor connected in series with the second gate and an output terminal, where the output terminal is connected between the first resistor and the load and provides an output voltage to the load; and a voltage divider connected in series with the second MOSFET and having a center terminal, where the center terminal is connected to the first gate. A source voltage is received across the second MOSFET and the voltage divider. A latching circuit is provided by the second MOSFET and the voltage divider being connected in parallel with the first MOSFET, the first resistor and the load. The second MOSFET discharges the first MOSFET based on a voltage drop across the first resistor to limit current to the output terminal.

In other features, the overcurrent protection circuit further includes a control module configured to generate a close control signal to close the first MOSFET and an open control signal to open the second MOSFET. The center terminal of the voltage divider and the first gate of the first MOSFET are configured to receive the close control signal. The second gate of the second MOSFET is configured to receive the open control signal.

In other features, the first resistor and the load form a voltage divider with a center terminal being the output terminal.

In other features, the overcurrent protection circuit further includes a control module configured to: supply and pulse a close control signal to the first gate of the first MOSFET to activate the latching circuit; and supply and pulse an open control signal to the second gate of the second MOSFET to deactivate the latching circuit.

In other features, the first MOSFET and the second MOSFET, while operating as part of the latching circuit, are configured to maintain a previous state without receiving a signal from a circuit external to the overcurrent protection circuit.

In other features, the voltage drop across the first resistor triggers the second MOSFET to discharge the first gate of the first MOSFET and open the first MOSFET to prevent current from being supplied to the load.

In other features, an overcurrent protection system includes: the overcurrent protection circuit; a diagnostic circuit connected to the output terminal, where the diagnostic circuit is configured to generate a diagnostic circuit output indicative of a diagnostic state of the overcurrent protection circuit; and a processing module configured to generate a diagnostic control signal to power ON the diagnostic circuit. The diagnostic circuit is configured to generate the diagnostic circuit output based on a last state of the diagnostic control signal received from the processing module.

In other features, the diagnostic circuit is configured to generate the diagnostic circuit output by looking up the diagnostic state in a lookup table using the last state of the diagnostic control signal and the diagnostic circuit output.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Overcurrent protection circuits may be used to detect amounts of current being supplied to loads and when the amounts of current exceed predetermined thresholds, disable power supplied to the loads. As an example, when a load is shorted to a ground reference, current supplied to the load can exceed a predetermined threshold. The overcurrent protection circuits may be used in combination with circuits for switching power to the loads ON and OFF. The overcurrent protection circuits and the power switching circuits may include alternating current (AC) circuit components and can be complex and consume considerable power.

The examples set forth herein include overcurrent protection systems that include circuits for switching power to loads (or electronic devices) ON and OFF while also providing overcurrent protection. The overcurrent protection systems include DC components and have minimally complex circuits with a minimum number of circuit components. In addition, the provided circuit arrangements and corresponding control minimizes the amount of time that circuit components are in an ON (or active) state. As a result, power consumption is minimized and the example overcurrent protection systems and circuits are suitable for low-power DC applications, such as applications providing low-voltages (e.g., 1.5-12V) via one or more batteries to electronic devices of a vehicle or a mobile network device (e.g., a mobile phone, a laptop computer, a tablet, etc.).

Figure 1:
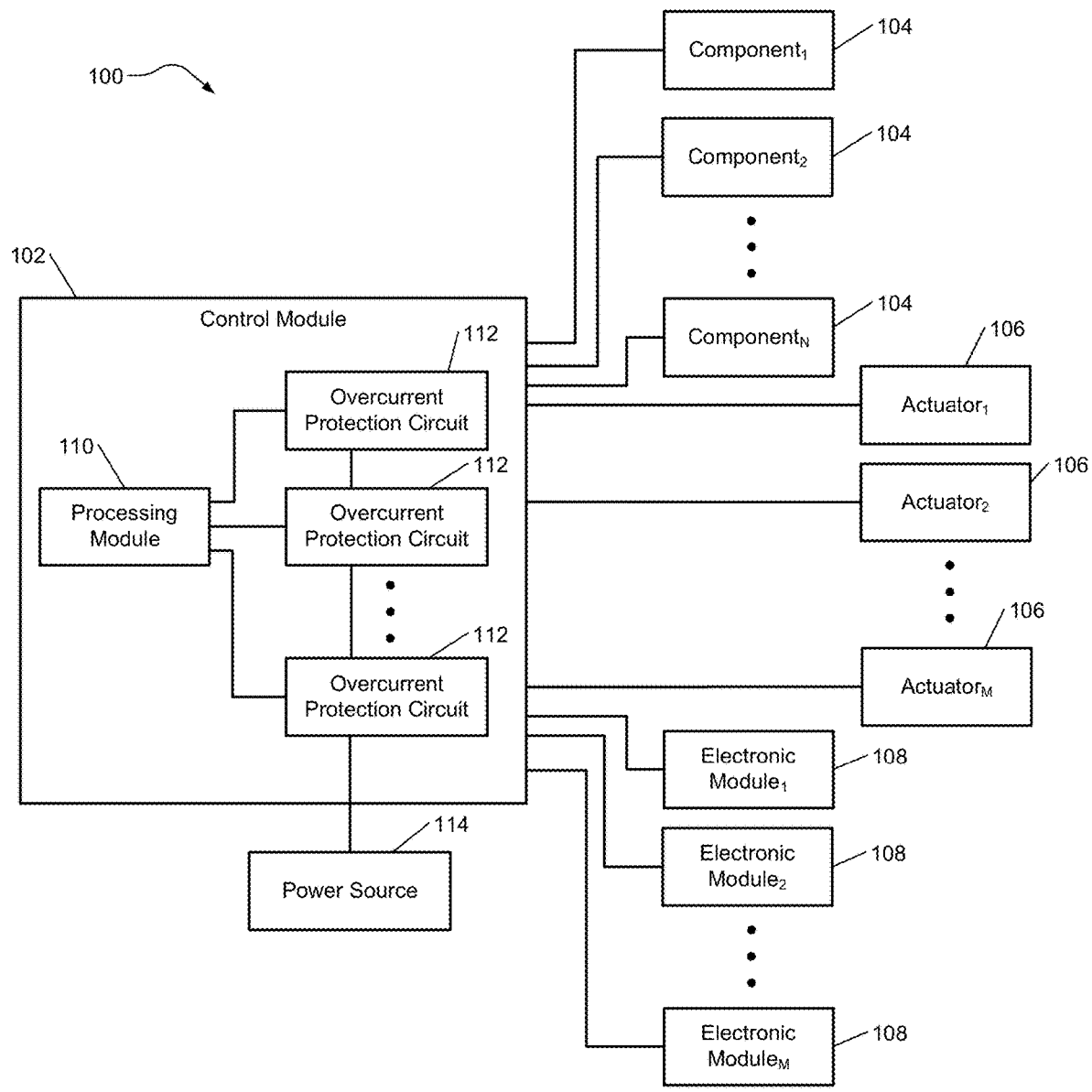
FIG. 1 a functional block diagram of an example of a control system including overcurrent protection circuits in accordance with an embodiment of the present disclosure.

FIG. 1 shows a control system 100 that includes a control module 102, components 104, actuators 106, and electronic modules 108. Any number of components, actuators and electronic modules may be included. The control module 102 may include a processing module 110 and overcurrent protection circuits 112. The overcurrent protection circuits 112 may receive power from a power source 114 and supply the power to the components 104, actuators 106 and electronic modules 108.

The overcurrent protection circuits 112 passively limit current supplied to the components 104, actuators 106 and electronic modules 108. The term "passively" refer to each of the overcurrent protection circuits 112 independently detecting voltage and/or current levels supplied to one or more loads and limiting current output. This current limiting is provided independent of and/or without externally received control signals, such as control signals from the processing module 110. The processing module 110 controls activation and deactivation of the overcurrent protection circuits 112 to power ON (or supply power to) and turn OFF (cease supplying power to) the components 104, the actuators 106 and the electronic modules 108. This activation and deactivation is accomplished via control signals as is further described below.

The components 104 may be lights, heating elements, and/or other electrical components. The actuators 106 may be fans, motors, pumps, and/or other actuators. The electronic modules 108 may be engine, transmission, and/or hybrid control modules, braking modules, communication modules, and/or other electronic modules. The power source 114 may include one or more batteries and/or other electrical power sources.

Figure 2:
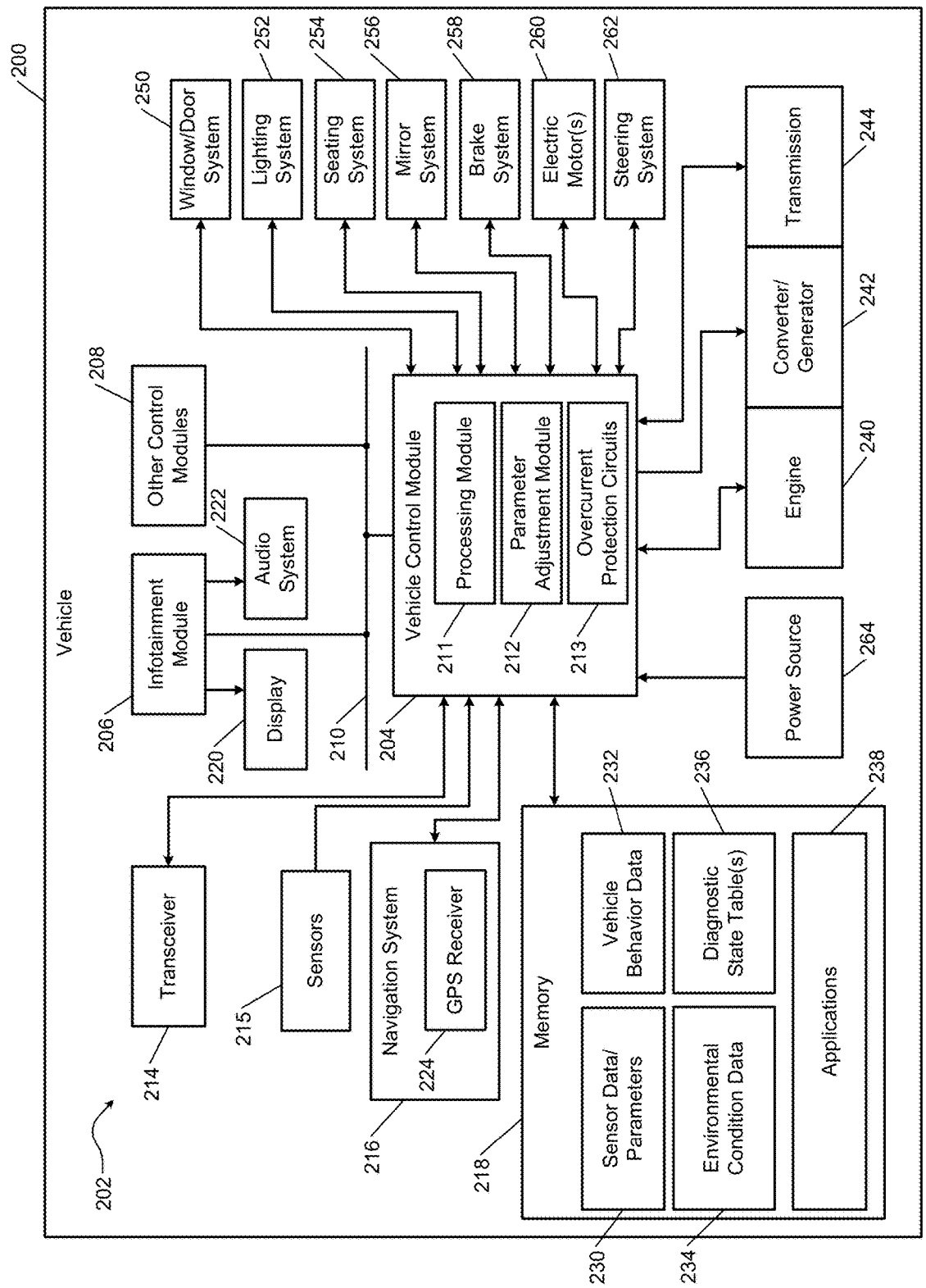
FIG. 2 is a functional block diagram of an example of a vehicle including a vehicle control module having overcurrent protection circuits in accordance with an embodiment of the present disclosure.

FIG. 2 shows a vehicle 200 that includes a vehicle control system 202, which includes a vehicle control module 204, an infotainment module 206 and other control modules 208. The modules 204, 206, 208 may communicate with each other via a controller area network (CAN) bus 210. The vehicle control module 204 may include a processing module 211, a parameter adjustment module 212, overcurrent protection circuits 213 and/or other modules, such as an engine control module, a transmission control module, a motor control module, etc. The parameter adjustment module 212 may be used to adjust parameters of the vehicle 200. The overcurrent protection circuits 213 may be configured and/or operate similarly as any of the overcurrent protection circuits described herein and may limit current supplied to any electronic components, actuators and electronic modules of the vehicle 200 some of which are described herein.

The vehicle control system 202 may further include a transceiver 214, sensors 215, a navigation system 216, a memory 218, a display 220 and an audio system 222. The sensors 215 may include cameras, objection detection sensors, temperature sensors, accelerometers, vehicle velocity sensor, and/or other sensors that provide parameters and/or data associated with the state of the vehicle 200, state of objects within the vehicle, and/or information regarding an environment in which the vehicle 200 is located. The sensors 215 detect environmental conditions and status of vehicle devices. The navigation system 216 may include a global positioning system (GPS) receiver 224. The GPS receiver 224 may provide vehicle velocity and/or direction (or heading) of the vehicle. The vehicle control module 204 transmits at least some of the data collected from the sensors 215 to other vehicle communication devices.

The memory 218 may store sensor data and/or parameters 230, vehicle behavior data 232, environmental condition data 234, one or more diagnostic state tables 236, and applications 238. An example diagnostic state table is shown below and described with respect to FIG. 7. The applications 238 may include applications executed by the modules 204, 206, 208 and/or other modules of the vehicle 200.

The vehicle control module 204 may control operation of an engine 240, a converter/generator 242, a transmission 244, a window/door system 250, a lighting system 252, a seating system 254, a mirror system 256, a brake system 258, electric motors 260 and/or a steering system 262 according to parameters set by the modules 204, 206, 208. The vehicle control module 204 may perform operations for collision avoidance, traffic lane guidance, adaptive cruise control, parking assistance, and/or other autonomous assistance activities. The vehicle control module 204 may receive power from a power source 264 which may be provided to the engine 240, the converter/generator 242, the transmission 244, the window/door system 250, the lighting system 252, the seating system 254, the mirror system 256, the brake system 258, the electric motors 260 and/or the steering system 262, etc.

The engine 240, the converter/generator 242, the transmission 244, the window/door system 250, the lighting system 252, the seating system 254, the mirror system 256, the brake system 258, the electric motors 260 and/or the steering system 262 may include actuators controlled by the vehicle control module 204 to, for example, adjust fuel, spark, air flow, steering wheel angle, throttle position, pedal position, door locks, window position, seat angles, etc. This control may be based on the outputs of the sensors 215, the navigation system 216, the GPS 224 and the above-stated data stored in the memory 218.

The overcurrent protection circuits may be used to limit current supplied to any of the modules 206, 208, the transceiver 214, the sensors 215, the systems 216, 222, 250, 252, 254, 256, 258, 260, 262 and/or components and/or modules thereof.

Figure 3:
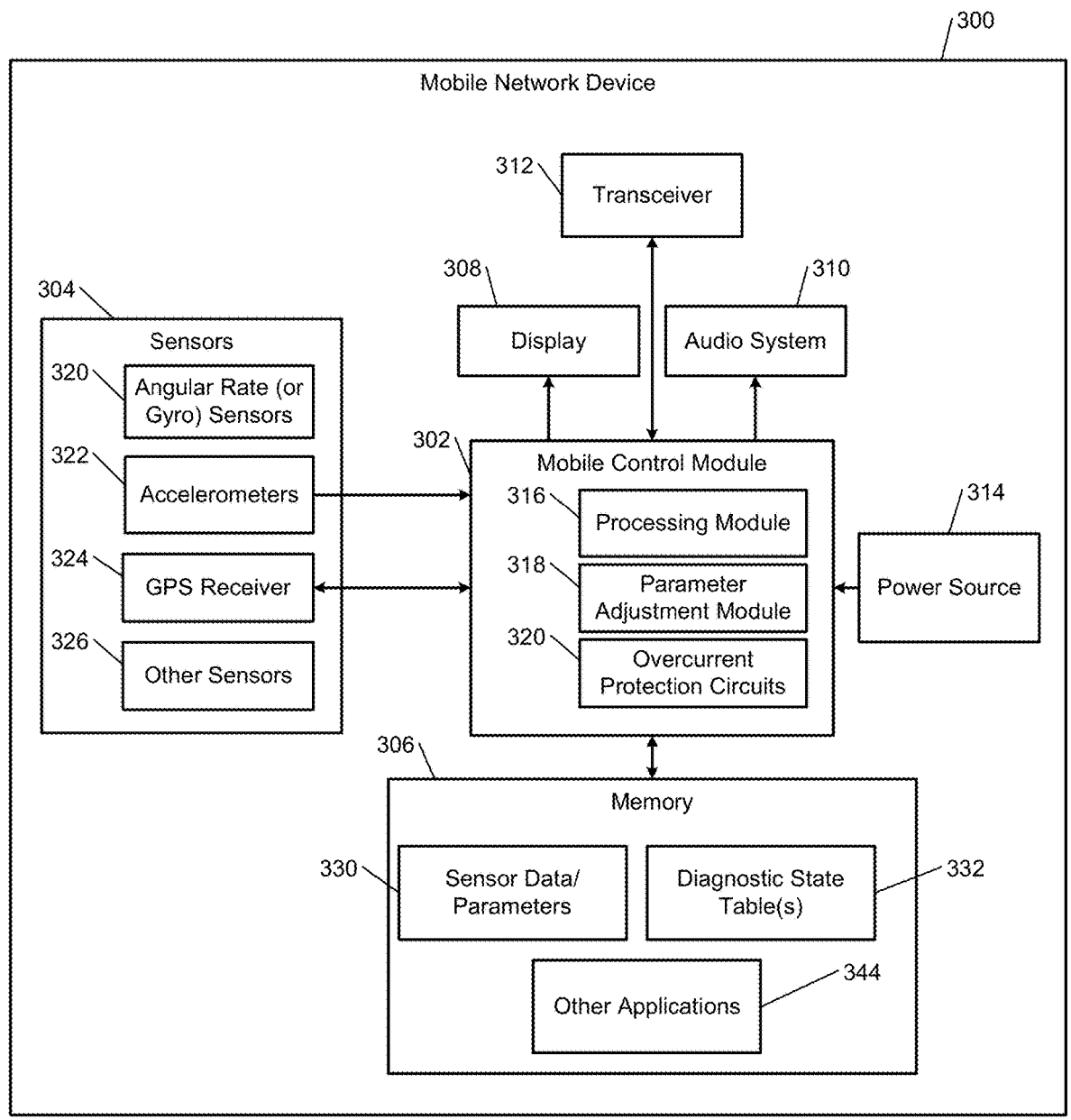
FIG. 3 is a functional block diagram of an example of a mobile network device incorporating overcurrent protection circuits in accordance with an embodiment of the present disclosure.

FIG. 3 shows a mobile network device 300, which may be a mobile phone, a laptop computer, a personal data assistant device, a wearable device, and/or other portable network device. The mobile network device 300 includes a mobile control module 302, sensors 304, a memory 306, a display 308, an audio system 310, a transceiver 312, and a power source 314. The mobile control module 302 may include a processing module 316, a parameter adjustment module 318 and overcurrent protection circuits 320 which limit current supplied from the power source 314 to electronic components and/or modules of the mobile network device 300. The overcurrent protection circuits 320 may be configured and/or operate similarly as any of the overcurrent protection circuits described herein.

The sensors 304 may include an angular rate (or gyro) sensors 320, accelerometers 322, a GPS receiver 324, and/or other sensors 326. The memory 306 stores sensor data 330 received from the sensors 320, 322, 324 and 326. The memory 306 also stores one or more diagnostic state tables 332 and other applications 344. An example diagnostic state table is shown below and described with respect to FIG. 7.

Figure 4:
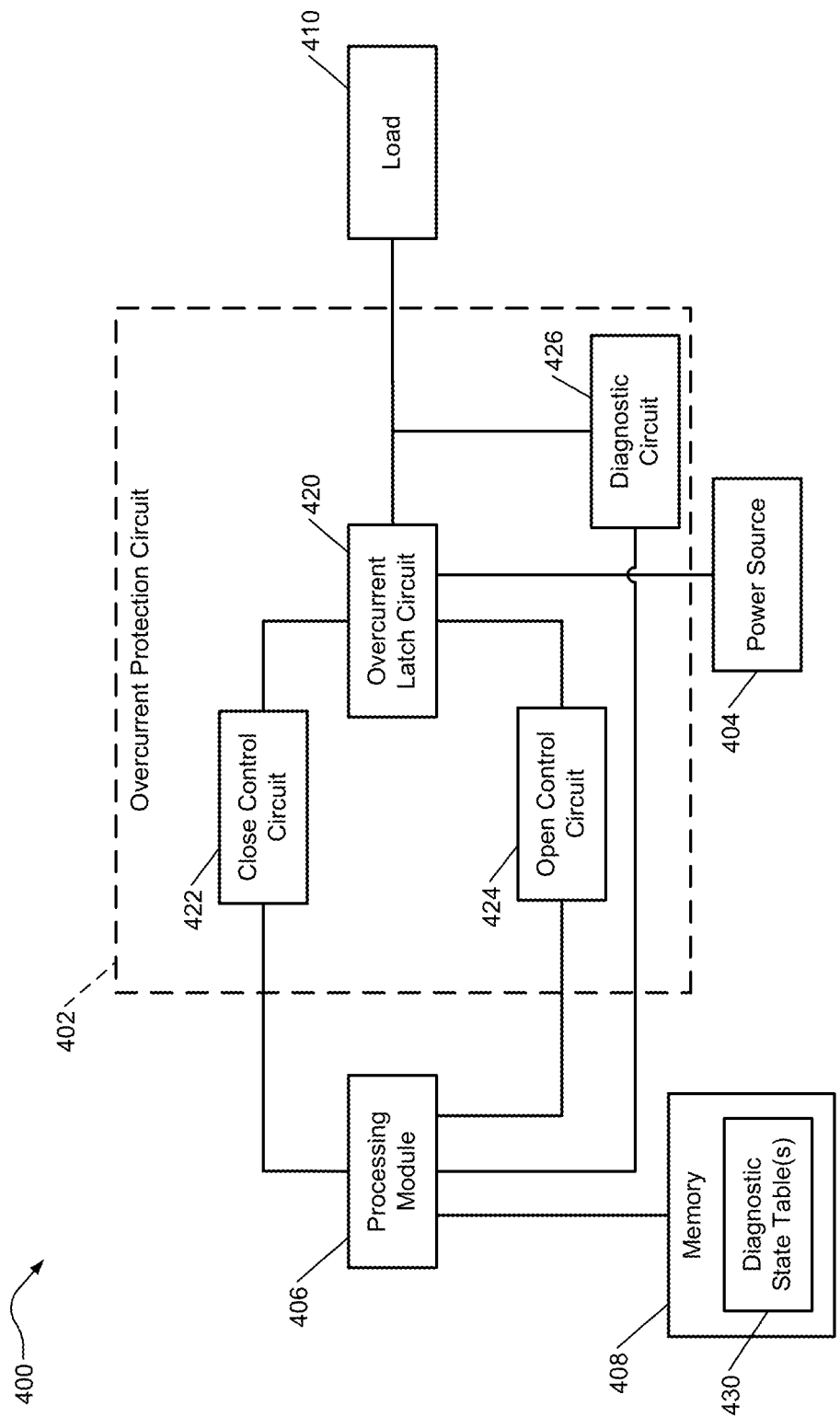
FIG. 4 is a functional block diagram illustrating an example of an overcurrent protection system in accordance with an embodiment of the present disclosure.

FIG. 4 shows an overcurrent protection system 400 that includes an overcurrent protection circuit 402, a power source 404, a processing module 406, and a memory 408. The overcurrent protection circuit 402 may replace any of the overcurrent protection circuits of FIGS. 1-3 and limits current supplied to a load 410. The load 410 may include one or more of the electronic components, actuators and/or modules referred to herein. The overcurrent protection circuit 402 includes an overcurrent latch circuit 420, a close control circuit 422, an open control circuit 424, and a diagnostic circuit 426. Although the overcurrent protection circuit 402 is shown including a single overcurrent latch circuit, a single close control circuit, a single open control circuit and a single diagnostic circuit, the overcurrent protection circuit 402 may include any number of overcurrent latch circuits, close control circuits, open control circuits and diagnostic circuits.

The overcurrent latch circuit 420 monitors voltage across the load 410 and/or current supplied to the load 410 and when the current exceeds a predetermined threshold cuts off current supplied to the load 410. This provides protection in, for example, a short circuit condition when the power supplied to the load 410 is shorted to a ground reference.

The processing module 406 may supply power to the load 410 by activating the overcurrent latch circuit 420 including signaling the close control circuit 422 to close one or more switches of the overcurrent latch circuit 420. This may include toggling a first one of the switches of the overcurrent latch circuit 420. The processing module 406 may stop supplying power to the load 410 by deactivating the overcurrent latch circuit 420 including signaling the open control circuit 424 to open one or more switches of the overcurrent latch circuit 420. This may include toggling a second one of the switches of the overcurrent latch circuit 420.

The diagnostic circuit 426 may monitor an output state and/or voltage of the overcurrent latch circuit 420 and based on a control signal received from the processing module 406 generate a diagnostic signal that is at least partially indicative of a diagnostic state of the overcurrent latch circuit 420. The control signal may be a signal powering ON or OFF the diagnostic circuit 426. The processing module 406 determines a diagnostic state of the overcurrent latch circuit 420 based on the diagnostic signal and a last control signal provided to the overcurrent latch circuit 420. The processing module 406 may then perform a countermeasure based on the diagnostic state. This may include generating an alert signal via, for example, one of the displays and/or audio systems referred to herein. The countermeasure may include controlling the open control circuit 424 to cease supplying power to the load 410 and/or performing some other countermeasure to prevent degradation of circuit components. The memory 408 includes one or more diagnostic state tables 430 as described herein and may perform the stated diagnostic operations based on the diagnostic state tables.

Figure 5:
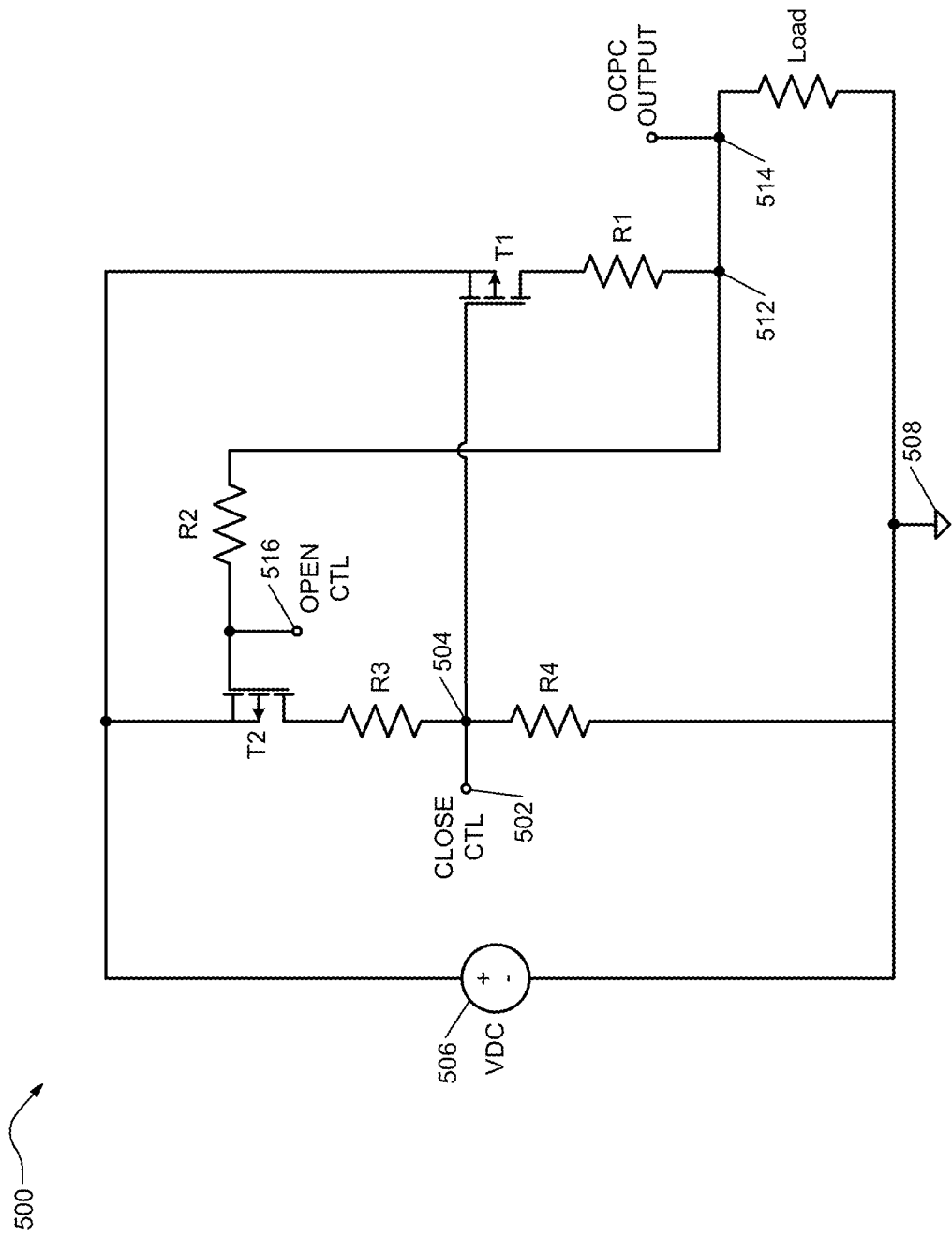
FIG. 5 is a schematic diagram of an example of an overcurrent protection circuit in accordance with an embodiment of the present disclosure.

FIG. 5 shows an overcurrent protection circuit 500 that may replace any overcurrent protection circuit referred to herein. The overcurrent protection circuit 500 includes a first switch T1 and a second switch T2 and resistors R1-R4. The switch T1 is used to switch current to a load. The switch T2 is used in combination with the switch T1 to limit current supplied to the load. In an embodiment, the switches T1, T2 may be implemented as metal-oxide-semiconductor field-effect transistors (MOSFETs), as shown. Although shown as MOSFETs, the switches T1, T2 may be implemented as bipolar junction transistors and/or other types of switches. MOSFETs may be implemented to minimize power consumed.

Resistor R1 is connected in series with and between the switch T1 and the load. A close control terminal 502 is connected to a gate (or control terminal) of the first switch T1. The close control terminal 502 may receive a close control signal CLOSE CTL from one of the processing modules disclosed herein. The close control signal CLOSE CTL may be toggled to activate the switch T1, which then deactivates the switch T2. The first switch T1, the resistor R1 and the load are connected in parallel with the switch T2 and the resistors R3, R4. The switch T2 is connected in series with the resistors R3, R4. The resistors R3, R4 provide a voltage divider with a center terminal 504 connected to the close control terminal 502 and the control terminal of the switch T1.

A terminal (e.g., source terminal) of the switch T2 is connected to a terminal (e.g., source terminal) of the switch T1 and a terminal of a DC power source 506. The resistor R4 is connected to the other terminal of the DC power source 506, the load and a ground reference 508. The resistor R2 is connected to the gate (or control terminal) of the switch T2, a terminal 512, and an output terminal 514. The terminal 512 is connected to the resistor R1 and the load. The signal outputted at the terminal 514 is an overcurrent protection circuit (OCPC) output signal. In an embodiment, the terminal 514 is connected to an anode of the load.

An open control terminal 516 is connected to the control terminal of the switch T2 and the resistor R2 and receives an open control signal OPEN CTL from the processing module. The open control signal OPEN CTL may be toggled to close the switch T2 and as a result open the switch T1 to cut off current supplied to the load.

The parallel arrangement of the switch T1, resistor R1 and load with the switch T2 and resistors R3, R4 provides a latch (or latching circuit) that maintains a prior state until one of the terminals 502, 516 is toggled. The state of the latch may also change in an overcurrent situation. For example, when the output terminal 514 is shorted to the ground reference 508, the current supplied to the terminal 514 exceeds a predetermined threshold, which is detected via the resistor R2. The resistor R1 creates a voltage drop proportional to the current supplied to the load and/or output terminal 514. In an overcurrent condition, the output terminal 514 is shorted to the ground reference and as a result the control terminal of the switch T2 transitions LOW, closing the switch T2 and as a result opening the switch T1. This decreases voltage across the resistor R1 and at the output terminal 514 and current supplied to the output terminal 514. The switch T2 discharges the gate of the switch T1 to open the switch T1 based on the voltage drop across resistor R1.

In an embodiment, the resistance of the resistor R1 is tunable to set the voltage threshold (or current threshold) at which the switch T2 is opened and as a result the gate of the switch T1 is discharged. The resistance R2 provides transient protection for the switch T2 by providing a delay to trigger the switch T2 during an overcurrent condition. In an embodiment, resistance of the resistor R2 is tunable to set the amount of delay. In an embodiment, resistances of the resistors R3, R4 are tunable based on the DC supply voltage to provide a proper bias voltage to the gate of the transistor T1.

The overcurrent protection circuit 500 provides overcurrent protection for a DC powered load, with a minimal number of circuit components and a minimal amount of associated dissipated power. The overcurrent protection circuit 500 may have as few as two field-effect transistors (FETs) and corresponding resistors and is adaptable to a wide range of supply voltages, output currents, and protection shutoff thresholds. The overcurrent protection circuit 500 operates as a latch and is able to hold either an open state or a closed state in the absence of external control. The open state refers to when power is not supplied to a load and the closed state refers to when power is supplied to the load. The overcurrent protection circuit 500 further includes the terminals 502, 516 for external switching between the open and closed states via a processing module.

Figure 6:
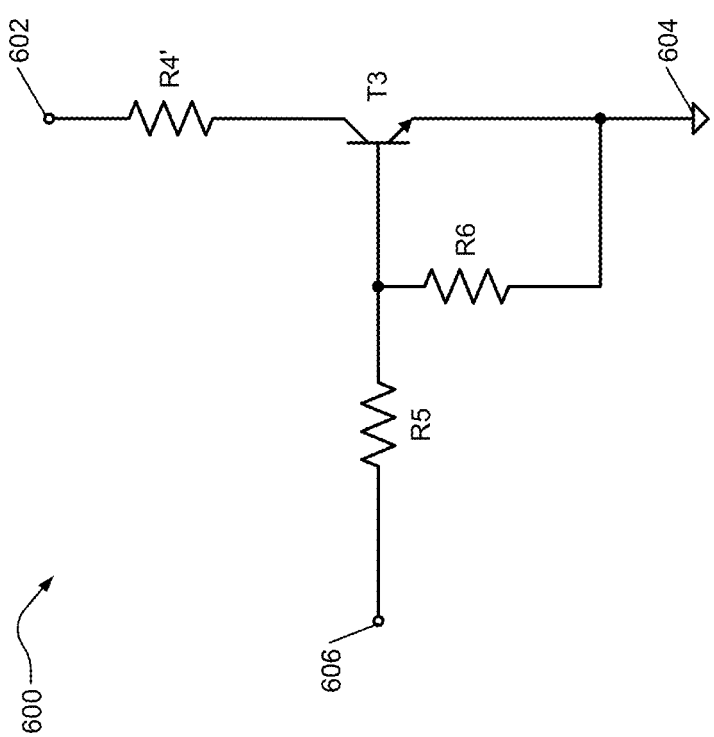
FIG. 6 is a schematic diagram of an example of a voltage converter circuit for switch state transitioning of an overcurrent protection circuit in accordance with an embodiment of the present disclosure.

FIG. 6 shows a voltage converter circuit 600 for switch state transitioning of an overcurrent protection circuit. The voltage converter circuit 600 includes a switch T3 and may include resistors R4', R5, R6. Resistance of resistor R4' may be the same or different than the resistance of resistor R4 of FIG. 5. The switch T3 may be implemented as a NPN bipolar junction transistor (BJT) as shown or as a MOSFET and/or other type of switch. The switch T3 is connected in series with the resistor R4' or other resistor and between a control terminal 602 and a ground reference 604. The control terminal 602 may be, for example, one of the terminals 502 or 516 of FIG. 5. The resistor R5 receives a control signal at an input 606 that is provided to the control terminal (or base) of the switch T3. The resistor R6 is connected to the control terminal, a terminal (or collector) of the switch T3 and the ground reference 604. The voltage converter circuit 600 converts a first voltage (supply voltage) received at the terminal 606 to a second voltage (control voltage) output at the terminal 602. One of the processing modules disclosed herein may generate the first voltage. In an embodiment, a version of the converter circuit 600 is included for each of the terminals 502, 516 of FIG. 5.

Figure 7:
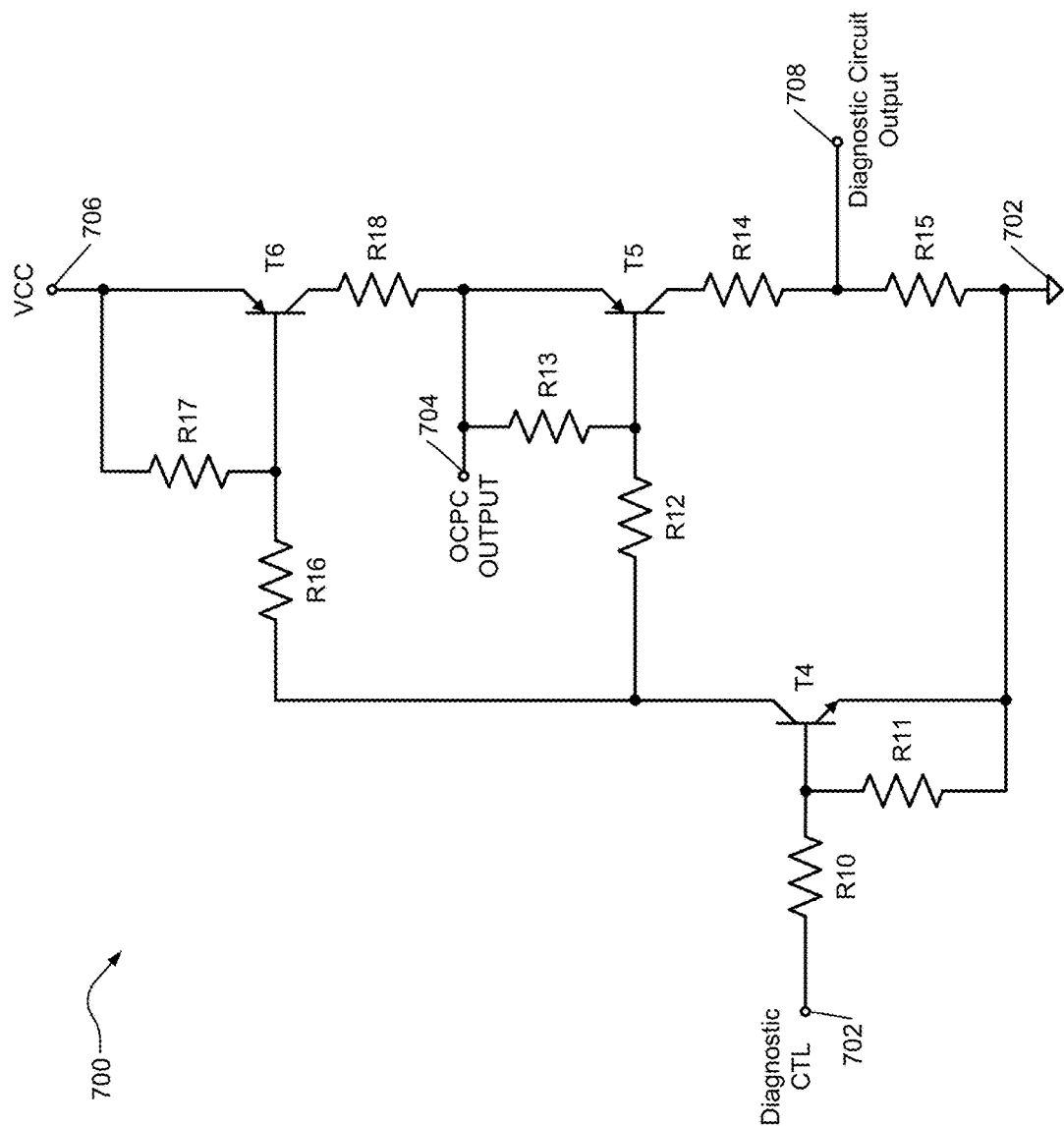
FIG. 7 is a schematic diagram of an example of a diagnostic circuit in accordance with an embodiment of the present disclosure.

FIG. 7 shows a diagnostic circuit 700 that determines a diagnostic state of one of the overcurrent protection circuits disclosed herein. A version of the diagnostic circuit 700 may be included for each overcurrent protection circuit disclosed herein. The diagnostic circuit 700 may include switches T4-T6 and resistors R10-R18. The switch T4 may be implemented as a NPN BJT as shown or as a MOSFET and/or other type of switch. The switches T5-T6 may be implemented PNP BJTs as shown or as MOSFETs and/or other suitable switches.

The resistor R10 is connected to an input terminal 702 and to a control terminal of the switch T4. The resistor R11 is connected to the control terminal and emitter of the switch T4 and to a ground reference 704. A collector of the switch T4 is connected to the resistors R12 and R16. The resistor R12 is connected to the resistor R13 and the control terminal of the switch T5. The resistor R13 is connected to the control terminal and the source of the switch T5 and to an OCPC output terminal 704 (e.g., the output terminal 514 of FIG. 5), which receives a corresponding output voltage. The resistor R16 is connected to the resistor R17 and to the control terminal of the switch T6. The resistor R17 is connected to the control terminal of the switch T6, the emitter of the switch T6 and a diagnostic circuit supply voltage VCC.

The switches T5, T6 and the resistors R14, R15, R18 are connected in series. The resistor R18 is connected between the switches T5, T6. The switch T6 is connected between the diagnostic circuit supply voltage terminal 706 and the resistor R18. The switch T5 is connected between the resistor R18 and the resistor R14. The resistor R14 is connected between the switch T5 and the resistor R15. A diagnostic circuit output terminal 708 is provided between the resistors R14, R15. The diagnostic circuit output provides a diagnostic signal that is at least partially indicative of a diagnostic state of the corresponding overcurrent protection circuit. The resistor R15 is connected to the ground reference 702.

Referring now to FIGS. 4, 5 and 7, the diagnostic circuit 700 may receive the diagnostic control signal Diagnostic CTL from the processing module 406 at terminal 702, the OCPC OUTPUT signal from the overcurrent protection circuit 500 at terminal 704 and output the Diagnostic Circuit Output signal at 708 to the processing module 406. The processing module 406 based on the Diagnostic Circuit Output signal and the last diagnostic control signal Diagnostic CTL provided to the terminal 702, determines the diagnostic state. The diagnostic state may be determined based on one of the diagnostic state tables 430, such as below provided diagnostic state table 1.

Diagnostic State Table 1

| Last Diagnostic CTL Signal | Diagnostic Circuit Output | Diagnostic Status |
|---|---|---|
| Close | HIGH | Switch T1 Closed and No Fault Exists |
|  | LOW | Switch T1 is Open and Short Circuit Condition Exists to Negative Terminal of DC Power Source (e.g., Terminal Connected to Resistor R3 and Load) |
| Open | HIGH | Switch T1 is Open Circuit or Short Circuit Condition Exists to Positive Terminal of DC Power Source (e.g., Terminal Connected to Source of Switch T1) |
|  | LOW | Switch T1 is Open and No Fault Exists |

The switch T6 trickles (provides a small amount of) current to the OCPC OUTPUT terminal 704 when the switch T1 is open to check for presence of the load. The Diagnostic Signal transitions HIGH if an open circuit/no load condition exists (when switch T1 is open) or if the OCPC Output is shorted to the positive terminal of the DC power source 506. Resistor R18 limits current through the switch T6 and is tunable to change an amount of open load detection delay. Closing (or turning ON) the switches T5 and T6 the Diagnostic Output Circuit Signal transitions to a state, which follows the state of the OCPC OUTPUT. R14, R15 provide a voltage divider. Resistances of the resistors R14, R15 may be tuned to set voltage levels of the Diagnostic Output Circuit Signal.

Figure 8:
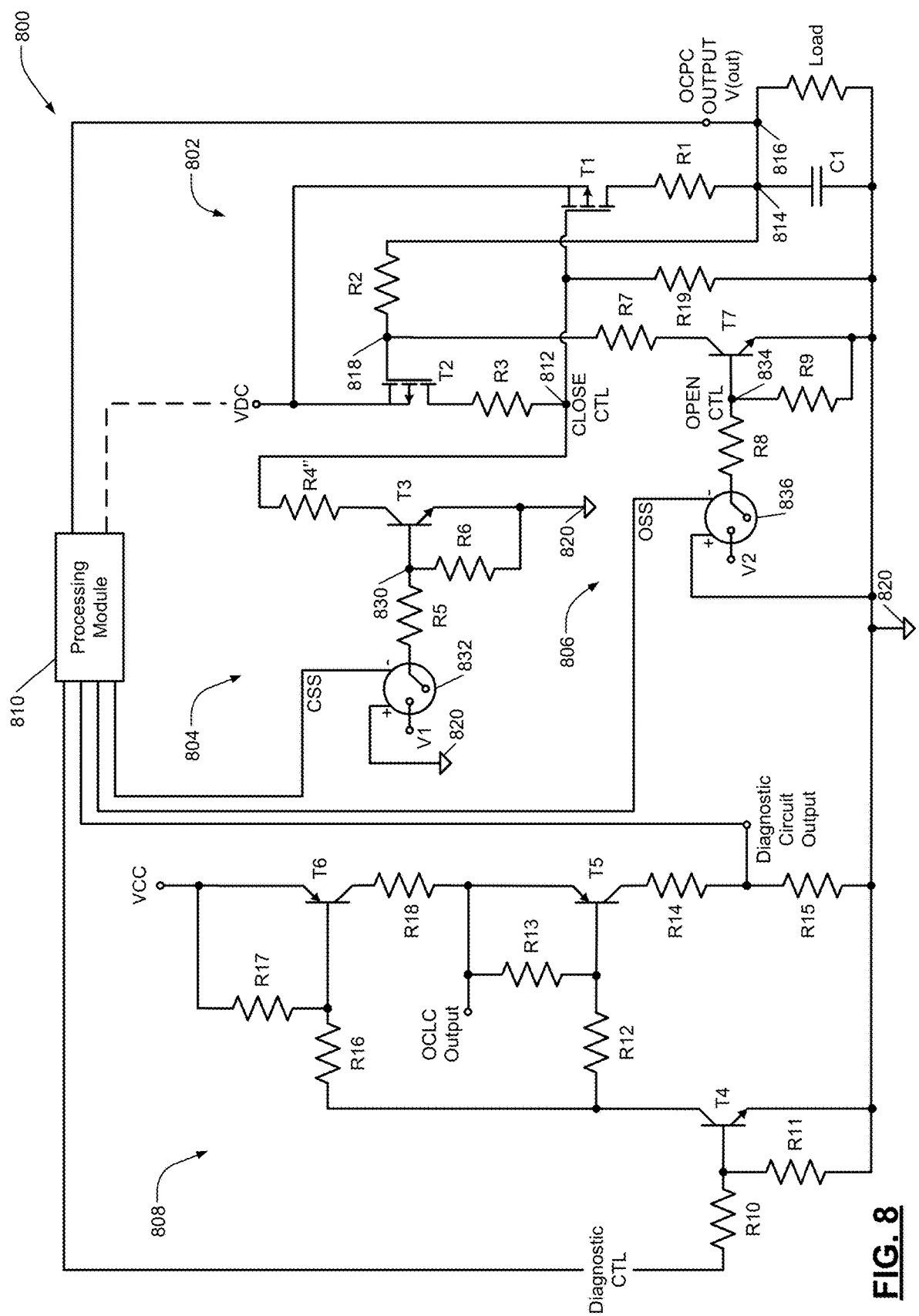
FIG. 8 is a schematic diagram of an example of another overcurrent protection system in accordance with an embodiment of the present disclosure.

FIG. 8 shows an overcurrent protection system 800 that includes an overcurrent protection circuit 802, a voltage converter circuits 804, 806, and a diagnostic circuit 808, which are similar to the circuits shown in FIGS. 5-7. The overcurrent protection system 800 also includes a processing module 810.

The overcurrent protection circuit 802 includes the switches T1, T2 and resistors R1, R2, R3 and R4". Resistance of resistor R4" may be the same or different than the resistances of resistors R4 and R4' of FIGS. 5-6. The switch T1 is used to switch current to a load. The switch T2 is used in combination with the switch T1 to limit current supplied to the load. In an embodiment, the switches T1, T2 may be implemented as MOSFETs as shown. Although shown as MOSFETs, the switches T1, T2 may be implemented as bipolar junction transistors and/or other types of switches.

Resistor R1 is connected in series with the switch T1 and the load. Resistor R1 may be connected between the switch T1 and a parallel combination of a capacitor C1 and the load. The capacitor C1 is connected in parallel with the load. A close control terminal 812 is connected to a gate (or control terminal) of the first switch T1. The close control terminal 812 may receive a close control signal CLOSE CTL from voltage converter circuit 804, which receives a close switch signal CSS from the processing module 810. The signals CLOSE CTL, CSS may be toggled to activate the switch T1, which then deactivates the switch T2. The first switch T1, the resistor R1, and the parallel combination of the capacitor C1 and the load are connected in parallel with the switch T2, the resistors R3 and R18. The switch T2 is connected in series with the resistors R3 and R18. The resistors R3, R18 are connected between the switches T2 and ground reference 820 and provide a voltage divider with a center terminal being the close control terminal 812 and connected to the control terminal of the switch T1. One end of a resistor R19 is connected to the close control terminal 812 and the control terminal of the switch T1 and a second end of the resistor R19 is connected to the ground reference 820.

A terminal (e.g., source terminal) of the switch T2 is connected to a terminal (e.g., source terminal) of the switch T1 and receives a DC voltage VDC, which may be from a DC power source. As shown the DC voltage VDC is provided by the processing module 810. The resistor R2 is connected to the gate (or control terminal) of the switch T2, a terminal 814 connected to the resistor R1 and the load, and an output terminal 816. The signal outputted at the terminal 816 is an overcurrent protection circuit (OCPC) output signal.

An open control terminal 818 is connected to the control terminal of the switch T2 and the resistor R2 and receives an open control signal OPEN CTL from the voltage converter circuit 806, which receives an open switch signal (OSS) from the processing module 810. The signals OPEN CTL, OSS may be toggled to close the switch T2 and as a result the switch T1 to limit current supplied to the load.

The parallel arrangement of the switch T1, resistor R1 and parallel combination of the capacitor C1 and the load with the switch T2 and resistors R3, R4" provides a latch (or latching circuit) that maintains a prior state until terminals 812, 818 are toggled. The state of the latch may also change in an overcurrent situation. For example, when the output terminal 816 is shorted to the ground reference 820, the current supplied to the terminal 816 exceeds a predetermined threshold, which is detected via the resistor R2. The resistor R1 creates a voltage drop proportional to the current supplied to the load and/or output terminal 816. In an overcurrent condition, the output terminal 816 is shorted to the ground reference 820 and as a result the control terminal of the switch T2 transitions LOW, closing the switch T2 and as a result opening the switch T1. This decreases voltage across the resistor R1 and at the output terminal 816 and current supplied to the output terminal 816. The switch T2 discharges the gate of the switch T1 to open the switch T1 based on the voltage drop across resistor R1.

In an embodiment, the resistance of the resistor R1 is tunable to set the voltage threshold (or current threshold) at which the switch T2 is opened and as a result the gate of the switch T1 is discharged. The resistance R2 provides transient protection for the switch T2 by providing a delay to trigger the switch T2 during an overcurrent condition. In an embodiment, resistance of the resistor R2 is tunable to set the amount of delay. In an embodiment, resistances of the resistors R3, R4" are tunable based on the DC supply voltage to provide a proper bias voltage to the gate of the transistor T1.

The voltage converter circuit 804 includes the switch T3 and may include resistors R4", R5, R6. The switch T3 may be implemented as a NPN BJT as shown or as another type of switch. The switch T3 is connected in series with the resistor R4" and between a control terminal 830 and the ground reference 820. The resistor R5 receives a control voltage V1 via a solenoid 832 (or the like) that is provided to the control terminal (or base) of the switch T3. The solenoid 832 receives a close switch signal (CSS) from the processing module 810. The CSS energizes the solenoid 832 and provides the first control voltage V1 to the resistor R5. The resistor R6 is connected to the control terminal, the collector of the switch T3 and the ground reference 820. The voltage converter circuit 804 converts the first control voltage to a first control output voltage at the terminal 812.

The voltage converter circuit 806 includes the switch T7 and may include resistors R7, R8, R9. The switch T7 may be implemented as a NPN BJT as shown or as another type of switch. The switch T7 is connected in series with the resistor R7 and between a control terminal 834 and the ground reference 820. The resistor R8 receives a control voltage V2 via a solenoid 836 (or the like) that is provided to the control terminal (or base) of the switch T7. The solenoid 836 receives an open switch signal (OSS) from the processing module 810. The CSS energizes the solenoid 836 and provides the second control voltage V2, which may be the same or different than the control voltage V1, to the resistor R8. The resistor R9 is connected to the control terminal, the collector of the switch T7 and the ground reference 820. The voltage converter circuit 806 converts the second control voltage to a second control output voltage at the terminal 818.

The diagnostic circuit 808 may include the switches T4-T6 and resistors R10-R18 of FIG. 7. The switches T4-T6 and resistors R10-R18 may be connected as connected in FIG. 7, where the Diagnostic Circuit Output is provided to the processing module 810. The processing module 810 may provide the Diagnostic CTL signal and monitor the OCPC OUTPUT.

Figure 9:
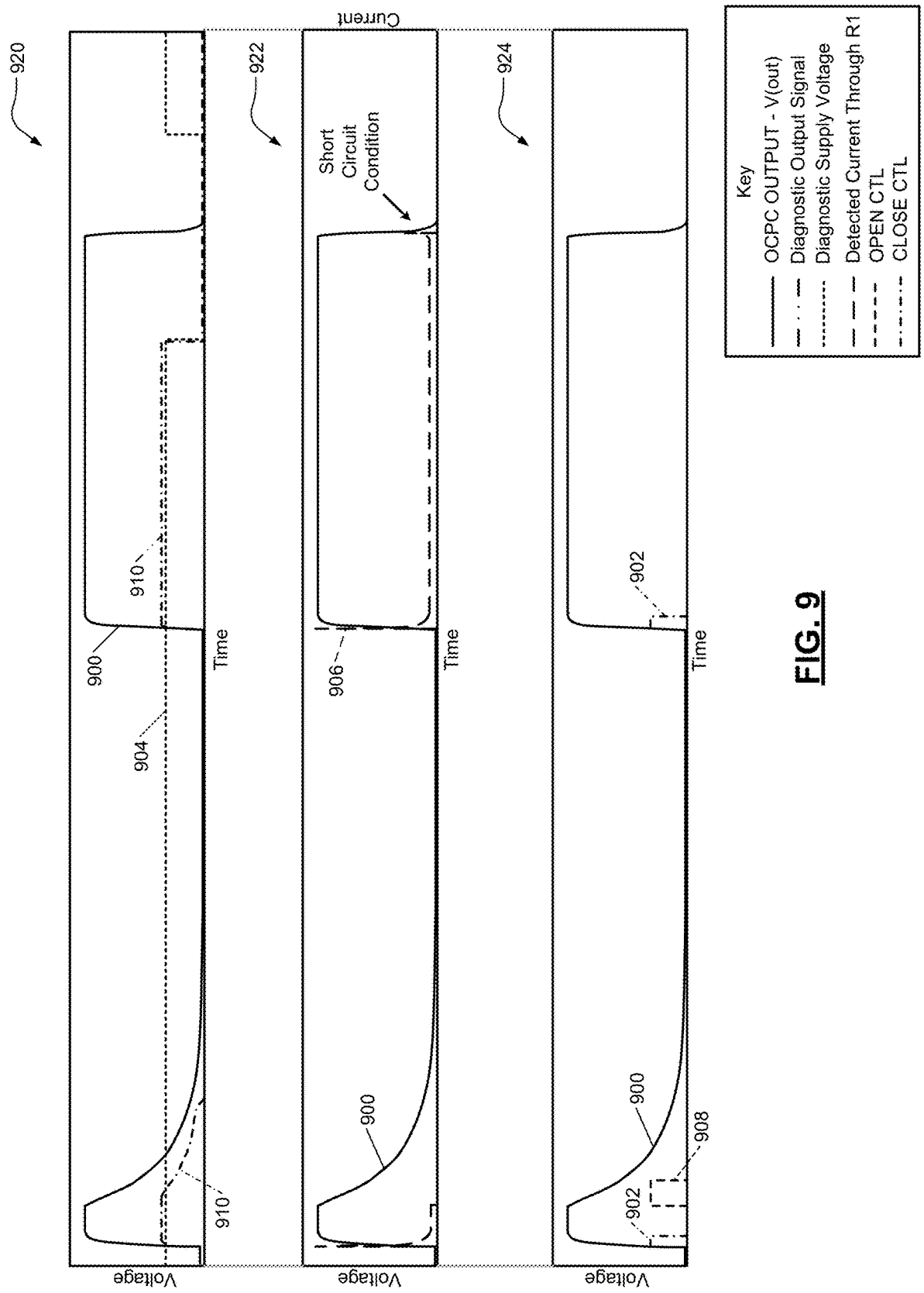
FIG. 9 is a transition diagram including example signal plots illustrating transition state changes of the overcurrent protection system of FIG. 8.

FIG. 9 shows a transition diagram including example signal plots illustrating transition state changes of the overcurrent protection system of FIG. 8. The plots include an OCPC OUTPUT signal 900, a diagnostic output signal 902, a diagnostic supply voltage (e.g., VCC) 904, a detected level of current through resistor R1 906, the open control signal OPEN CTL 908 and the close control signal CLOSE CTL 910.

A first graph 920 includes the OCPC OUTPUT signal 900, the diagnostic output signal 902 and the diagnostic supply voltage (e.g., VCC) 904. Initially the diagnostic output signal 902 indicates a normal ON state by transitioning HIGH and then signals a normal OFF state by transitioning LOW. The diagnostic output signal 902 then indicates another normal ON state by transitioning HIGH a second time. During these three transitions the diagnostic circuit 808 is in an ON state as indicated by the diagnostic supply voltage 904 being HIGH. While the OCPC OUTPUT signal 900 is in the second shown HIGH state, the diagnostic circuit 808 is deactivated and the diagnostic output signal 902 transitions LOW.

A second graph 922 shows the OCPC OUTPUT signal 900 and the detected level of current through resistor R1 906. As is shown the current through resistor R1 spikes each time the switch T1 is activated. In the example shown, a short circuit condition exists while the switch T1 is closed as illustrated during the second HIGH state of the OCPC OUTPUT signal 900. Subsequent to the short circuit condition occurring, the diagnostic circuit 808 is switched back ON, as shown in the first graph and indicates that a short circuit condition exists.

A third graph 924 shows the close control signal CLOSE CTL being toggled to close switch T1 and set the OCPC OUTPUT signal 900 HIGH. The open control signal OPEN CTL is then toggled to discharge the switch T1 as shown by the voltage of the OCPC OUTPUT signal 900 gradually transitioning to a LOW state. Although the open control signal OPEN CTL is shown as being toggled HIGH and then LOW, the open control signal OPEN CTL is actually pulsed LOW in order for the switch T2 to OPEN. In the example shown, the close control signal CLOSE CTL is then toggled again to close switch T1 and set the OCPC OUTPUT signal 900 HIGH.

The present disclosure provides an overcurrent protection circuit comprising a first switch comprising a first control terminal and configured to switch current to a load ON and OFF, a first resistor connected in series with the first switch, a second switch comprising a second control terminal, a second resistor connected in series with the second control terminal and an output terminal of the overcurrent protection circuit, and a voltage divider connected in series with the second switch and having a center terminal, wherein the center terminal is connected to the first control terminal. A direct current source voltage is received across the second switch and the voltage divider. A latching circuit is provided by the second switch and the voltage divider being connected in parallel with the first switch, the first resistor and the load. The second switch discharges the first switch to limit current to the output terminal in response to a voltage drop across the first resistor indicating current supplied to the output terminal has exceeded a predetermined threshold.

In other features, the overcurrent protection circuit further comprises a control module configured to generate a close control signal to close the first switch. The center terminal of the voltage divider and the first control terminal of the first switch are configured to receive the close control signal.

In other features, the overcurrent protection circuit further comprises a control module configured to generate an open control signal to open the second switch. The second control terminal of the second switch is configured to receive the open control signal.

In other features, the first resistor and the load form a voltage divider with a center terminal being the output terminal.

In other features, the overcurrent protection circuit further comprises a control module configured to supply and pulse a close control signal to the first switch to activate the latching circuit and supply and pulse an open control signal to the second switch to deactivate the latching circuit.

In other features, the first switch and the second switch are metal-oxide-semiconductor field effect transistors.

The first switch and the second switch, while operating as part of the latching circuit, are configured to maintain a previous state without receiving a signal from a circuit external to the overcurrent protection circuit.

In other features, the voltage drop across the first resistor triggers the second switch to discharge a gate of the first switch and open the first switch to prevent current from being supplied to the load.

The present disclosure also provides an overcurrent protection system comprising the overcurrent protection circuit and a diagnostic circuit connected to the output terminal. The diagnostic circuit is configured to generate a diagnostic circuit output indicative of a diagnostic state of the overcurrent protection circuit.

In other features, the overcurrent protection system further comprises a processing module configured to generate a diagnostic control signal to power ON the diagnostic circuit. The diagnostic circuit is configured to generate the diagnostic circuit output based on a last state of the diagnostic control signal received from the processing module.

In other features, the diagnostic circuit is configured to generate the diagnostic circuit output by looking up the diagnostic state in a lookup table using the last state of the diagnostic control signal and the diagnostic circuit output.

In other features, the diagnostic circuit comprises a third switch receiving a diagnostic control signal and a fourth switch and a fifth switch controlling generation of the diagnostic circuit output based on an output of the third switch and an output of the overcurrent protection circuit.

The present disclosure also provides an overcurrent protection circuit system comprising a first metal-oxide-semiconductor field effect transistor (MOSFET) comprising a first gate and configured to switch current to a load ON and OFF, a first resistor connected in series with the first MOSFET, a second MOSFET comprising a second gate, a second resistor connected in series with the second gate and an output terminal, wherein the output terminal is connected between the first resistor and the load and provides an output voltage to the load, and a voltage divider connected in series with the second MOSFET and having a center terminal, wherein the center terminal is connected to the first gate. A source voltage is received across the second MOSFET and the voltage divider, a latching circuit is provided by the second MOSFET and the voltage divider being connected in parallel with the first MOSFET, the first resistor and the load, and the second MOSFET discharges the first MOSFET based on a voltage drop across the first resistor to limit current to the output terminal.

In other features, the overcurrent protection circuit further comprises a control module configured to generate a close control signal to close the first MOSFET and an open control signal to open the second MOSFET. The center terminal of the voltage divider and the first gate of the first MOSFET are configured to receive the close control signal and the second gate of the second MOSFET is configured to receive the open control signal.

In other features, the first resistor and the load form a voltage divider with a center terminal being the output terminal.

In other features, the overcurrent protection circuit further comprises a control module configured to supply and pulse a close control signal to the first gate of the first MOSFET to activate the latching circuit and supply and pulse an open control signal to the second gate of the second MOSFET to deactivate the latching circuit.

In other features, the first MOSFET and the second MOSFET, while operating as part of the latching circuit, are configured to maintain a previous state without receiving a signal from a circuit external to the overcurrent protection circuit.

In other features, the voltage drop across the first resistor triggers the second MOSFET to discharge the first gate of the first MOSFET and open the first MOSFET to prevent current from being supplied to the load.

The present disclosure also provides an overcurrent protection system comprising the overcurrent protection circuit and a diagnostic circuit connected to the output terminal. The diagnostic circuit is configured to generate a diagnostic circuit output indicative of a diagnostic state of the overcurrent protection circuit and a processing module configured to generate a diagnostic control signal to power ON the diagnostic circuit. The diagnostic circuit is configured to generate the diagnostic circuit output based on a last state of the diagnostic control signal received from the processing module.

In other features, the diagnostic circuit is configured to generate the diagnostic circuit output by looking up the diagnostic state in a lookup table using the last state of the diagnostic control signal and the diagnostic circuit output.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An overcurrent protection circuit comprising:
a first switch comprising a first control terminal and configured to switch current to a load ON and OFF;
a first resistor connected in series with the first switch;
a second switch comprising a second control terminal;
a second resistor connected in series with the second control terminal and an output terminal of the overcurrent protection circuit; and
a voltage divider connected in series with the second switch and having a center terminal, wherein the center terminal is connected to the first control terminal,
wherein
a direct current source voltage is received across the second switch and the voltage divider,
a latching circuit is provided by the second switch and the voltage divider being connected in parallel with the first switch, the first resistor and the load, and
the second switch discharges the first switch to limit current to the output terminal in response to a voltage drop across the first resistor indicating current supplied to the output terminal has exceeded a predetermined threshold.

2. The overcurrent protection circuit of claim 1, further comprising a control module configured to generate a close control signal to close the first switch,
wherein the center terminal of the voltage divider and the first control terminal of the first switch are configured to receive the close control signal.

3. The overcurrent protection circuit of claim 1, further comprising a control module configured to generate an open control signal to open the second switch,
wherein the second control terminal of the second switch is configured to receive the open control signal.

4. The overcurrent protection circuit of claim 1, wherein the first resistor and the load form a voltage divider with a center terminal being the output terminal.

5. The overcurrent protection circuit of claim 1, further comprising a control module configured to:
supply and pulse a close control signal to the first switch to activate the latching circuit; and
supply and pulse an open control signal to the second switch to deactivate the latching circuit.

6. The overcurrent protection circuit of claim 1, wherein the first switch and the second switch are metal-oxide-semiconductor field effect transistors.

7. The overcurrent protection circuit of claim 1, wherein the first switch and the second switch, while operating as part of the latching circuit, are configured to maintain a previous state without receiving a signal from a circuit external to the overcurrent protection circuit.

8. The overcurrent protection circuit of claim 1, wherein, the voltage drop across the first resistor triggers the second switch to discharge a gate of the first switch and open the first switch to prevent current from being supplied to the load.

9. An overcurrent protection system comprising:
the overcurrent protection circuit of claim 1; and
a diagnostic circuit connected to the output terminal,
wherein the diagnostic circuit is configured to generate a diagnostic circuit output indicative of a diagnostic state of the overcurrent protection circuit.

10. The overcurrent protection system of claim 9, further comprising a processing module configured to generate a diagnostic control signal to power ON the diagnostic circuit,
wherein the diagnostic circuit is configured to generate the diagnostic circuit output based on a last state of the diagnostic control signal received from the processing module.

11. The overcurrent protection system of claim 10, wherein the diagnostic circuit is configured to generate the diagnostic circuit output by looking up the diagnostic state in a lookup table using the last state of the diagnostic control signal and the diagnostic circuit output.

12. The overcurrent protection system of claim 9, wherein the diagnostic circuit comprises:
a third switch receiving a diagnostic control signal; and
a fourth switch and a fifth switch controlling generation of the diagnostic circuit output based on an output of the third switch and an output of the overcurrent protection circuit.

13. An overcurrent protection circuit system comprising:
a first metal-oxide-semiconductor field effect transistor (MOSFET) comprising a first gate and configured to switch current to a load ON and OFF;
a first resistor connected in series with the first MOSFET;
a second MOSFET comprising a second gate;
a second resistor connected in series with the second gate and an output terminal, wherein the output terminal is connected between the first resistor and the load and provides an output voltage to the load; and
a voltage divider connected in series with the second MOSFET and having a center terminal, wherein the center terminal is connected to the first gate,
wherein
a source voltage is received across the second MOSFET and the voltage divider,
a latching circuit is provided by the second MOSFET and the voltage divider being connected in parallel with the first MOSFET, the first resistor and the load, and
the second MOSFET discharges the first MOSFET based on a voltage drop across the first resistor to limit current to the output terminal.

14. The overcurrent protection circuit of claim 13, further comprising a control module configured to generate a close control signal to close the first MOSFET and an open control signal to open the second MOSFET, wherein:
the center terminal of the voltage divider and the first gate of the first MOSFET are configured to receive the close control signal; and
the second gate of the second MOSFET is configured to receive the open control signal.

15. The overcurrent protection circuit of claim 13, wherein the first resistor and the load form a voltage divider with a center terminal being the output terminal.

16. The overcurrent protection circuit of claim 13, further comprising a control module configured to:
supply and pulse a close control signal to the first gate of the first MOSFET to activate the latching circuit; and
supply and pulse an open control signal to the second gate of the second MOSFET to deactivate the latching circuit.

17. The overcurrent protection circuit of claim 13, wherein the first MOSFET and the second MOSFET, while operating as part of the latching circuit, are configured to maintain a previous state without receiving a signal from a circuit external to the overcurrent protection circuit.

18. The overcurrent protection circuit of claim 13, wherein, the voltage drop across the first resistor triggers the second MOSFET to discharge the first gate of the first MOSFET and open the first MOSFET to prevent current from being supplied to the load.

19. An overcurrent protection system comprising:
the overcurrent protection circuit of claim 13;
a diagnostic circuit connected to the output terminal,
wherein the diagnostic circuit is configured to generate a diagnostic circuit output indicative of a diagnostic state of the overcurrent protection circuit; and
a processing module configured to generate a diagnostic control signal to power ON the diagnostic circuit,
wherein the diagnostic circuit is configured to generate the diagnostic circuit output based on a last state of the diagnostic control signal received from the processing module.

20. The overcurrent protection system of claim 19, wherein the diagnostic circuit is configured to generate the diagnostic circuit output by looking up the diagnostic state in a lookup table using the last state of the diagnostic control signal and the diagnostic circuit output.

* * * * *